(12) United States Patent
Yang

(10) Patent No.: US 10,181,489 B2
(45) Date of Patent: Jan. 15, 2019

(54) IMAGE SENSOR HAVING NANO VOIDS AND METHOD FOR FABRICATING THE SAME

(71) Applicant: SK hynix Inc., Gyeonggi-do (KR)

(72) Inventor: Yun-Hui Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 104 days.

(21) Appl. No.: 15/437,748

(22) Filed: Feb. 21, 2017

(65) Prior Publication Data

US 2017/0365630 A1 Dec. 21, 2017

(30) Foreign Application Priority Data

Jun. 21, 2016 (KR) ........................ 10-2016-0077063

(51) Int. Cl.
*H01L 27/146* (2006.01)

(52) U.S. Cl.
CPC .... *H01L 27/1463* (2013.01); *H01L 27/14621* (2013.01); *H01L 27/14627* (2013.01); *H01L 27/14643* (2013.01); *H01L 27/1464* (2013.01); *H01L 27/14609* (2013.01); *H01L 27/14641* (2013.01); *H01L 27/14689* (2013.01)

(58) Field of Classification Search
None
See application file for complete search history.

(56) References Cited

U.S. PATENT DOCUMENTS 7,459,735 B2   12/2008   Ezaki et al.
7,470,944 B2   12/2008   Ishida et al.

*Primary Examiner* — Cheung Lee
(74) *Attorney, Agent, or Firm* — IP & T Group LLP

(57) ABSTRACT

An image sensor includes a plurality of photodiodes formed in a substrate; nano void regions formed in the substrate adjacent to sides of each photodiode of the plurality of photodiodes; and a plurality of nano voids formed in each nano void region of the nano void regions.

15 Claims, 15 Drawing Sheets

IMAGE SENSOR HAVING NANO VOIDS AND METHOD FOR FABRICATING THE SAME

CROSS-REFERENCE TO RELATED APPLICATIONS

The present application claims priority to Korean Patent Application No. 10-2016-0077063, filed on Jun. 21, 2016, which is herein incorporated by reference in its entirety.

BACKGROUND

Exemplary embodiments of the present invention relate to a semiconductor designing technology, and more particularly, to an image sensor having nano voids and a method for fabricating the image sensor.

An image sensor is a device that converts an optical image into electrical signals. Recently, as the computer and communication industries evolve, demands for image sensors with a high integration degree and improved performance are increasing in diverse devices such as digital cameras, camcorders, Personal Communication Systems (PCS), game players, security surveillance cameras, medical micro cameras, robots and the like. However, heavy metal contamination of a photodiode and the surrounding area of the photodiode adversely affects the performance and lifespan of an image sensor.

SUMMARY

Exemplary embodiments of the present invention are directed to an image sensor that may effectively control heavy metal contamination of a photodiode and the surrounding region of the photodiode.

Exemplary embodiments of the disclosure are directed to a method for fabricating an image sensor that may effectively control heavy metal contamination of a photodiode and the surrounding region of the photodiode.

Besides the objectives of the exemplary embodiments of the present invention described above, the following description may provide other diverse objectives that may be obvious to and understood by those skilled in the art to which the present invention pertains.

In accordance with an exemplary embodiment of the present invention, an image sensor includes: a plurality of photodiodes formed in a substrate; nano void regions formed in the substrate adjacent to sides of each photodiode of the plurality of photodiodes; and a plurality of nano voids formed in each nano void region of the nano void regions.

In an exemplary embodiment of the disclosure, each nano void region may include a first portion and a second portion, and a density of the plurality of nano voids in the first portion is different than a density of the plurality of nano voids in the second portion. Each photodiode, of the plurality of photodiodes, may include a first N-type impurity region having a first concentration of an N-type impurity, and a second N-type impurity region having a second concentration of an N-type impurity that is less than the first concentration. Each nano void region may include a first portion, having a first density of the plurality of nano voids, disposed in proximity to the first N-type impurity region, and a second portion, having a second density of the plurality of the nano voids that is less than the first density, disposed in proximity to the second N-type impurity region. An upper end of the first portion of each nano void region may be disposed lower than an upper end of the first N-type impurity region. A lower end of the first portion of each nano void region may be disposed at substantially a same level as an interface between the first N-type impurity region and the second N-type impurity region, or lower than the interface between the first N-type impurity region and the second N-type impurity region. The second portion of each nano void region may be disposed in proximity to sides of the second N-type impurity region, and a lower end of the second portion is disposed at a level below a level of a lower end of the second N-type impurity region. The nano void regions may be formed between the plurality of photodiodes. The nano void regions may surround the sides of the plurality of photodiodes. The nano void regions may be formed spaced apart from the plurality of photodiodes. The nano void regions may be formed spaced apart from an upper surface or a lower surface of the substrate.

In an exemplary embodiment of the disclosure, the image sensor may further include: an isolation layer in the substrate disposed between the plurality of photodiodes, wherein at least a portion of each nano void region, of the nano void regions, is formed in the isolation layer. The nano void regions may surround the plurality of photodiodes.

In an exemplary embodiment of the disclosure, an image sensor includes: a plurality of photodiodes formed in a substrate; nano void regions formed in the substrate adjacent to sides of each photodiode of the plurality of photodiodes; a plurality of nano voids formed in each nano void region of the nano void regions; a color filter layer disposed over the plurality of photodiodes; and a micro lens layer disposed over the color filter layer.

In an exemplary embodiment of the disclosure, each photodiode, of the plurality of the photodiodes, may include a first N-type impurity region having a first concentration of an N-type impurity and a second N-type impurity region having a second concentration of an N-type impurity that is less than the first concentration. Each nano void region may include a first portion, having a first density of the nano voids, disposed in proximity to the first N-type impurity region, and a second portion, having a second density of the nano voids that is less than the first density, disposed in proximity to the second N-type impurity region. The second N-type impurity region may be formed between the first N-type impurity region and the color filter layer.

In an exemplary embodiment of the disclosure, a method for fabricating an image sensor includes: forming nano void regions and photodiodes in a substrate; and forming a layer having conductive lines over the substrate, wherein the nano void regions in the substrate having a plurality of pixel regions, wherein the photodiodes in the plurality of the pixel regions in the substrate, and wherein the nano void regions are formed adjacent to sides of the photodiodes.

In an exemplary embodiment of the disclosure, the forming photodiodes in a plurality of pixel regions may be performed before the forming nano void regions. The forming photodiodes in a plurality of pixel regions may be performed after the forming of the nano void regions. The forming nano void regions may include: implanting ions, via ion implantation, in a region bordering each pixel region of the plurality of pixel regions; and diffusing, via a thermal treatment, ions from the region bordering each pixel region to form nano voids. The implanting ions may further include: implanting at least one of hydrogen ions, helium ions, or a combination thereof. The implanting ions may further include: varying an ion concentration based on an implantation depth in the substrate and an implantation energy used to implant the ions. The forming photodiodes may further include: implanting, at a first concentration, an N-type impurity in the substrate to form a first N-type impurity region, and implanting, at a second concentration that is less than the first concentration, an N-type impurity in the substrate to form a second N-type impurity region below the first N-type impurity region. The forming nano void regions may further include: implanting, using a first implantation energy, ions at a first concentration in a region bordering each pixel region, of the plurality of the pixel regions, at a first depth, implanting, using a second implantation energy different than the first implantation energy, ions at a second concentration, different than the first concentration, in the region bordering each pixel region, of the plurality of the pixel regions, at a second depth greater than the first depth; and thermally treating the substrate to diffuse the ions at the first concentration to form a first plurality of nano voids having a first density and to diffuse the ions at the second concentration to form a second plurality of nano voids having a second density different than the first density.

DETAILED DESCRIPTION

Figure 1:
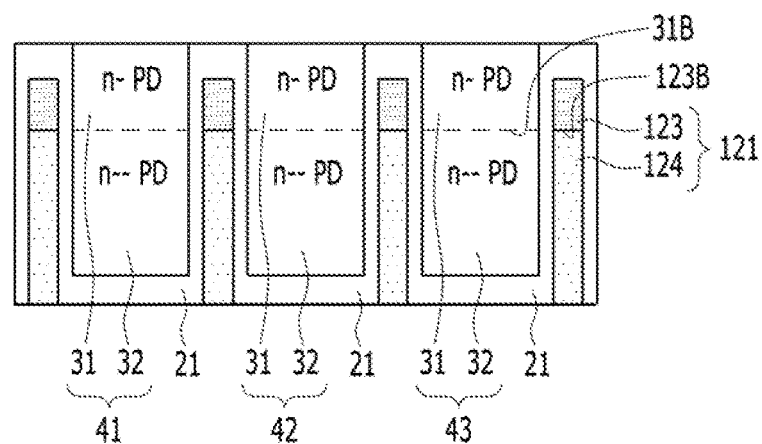
FIG. 1 is a cross-sectional view illustrating a structure of an image sensor in accordance with an exemplary embodiment of the present invention.

Exemplary embodiments of the present invention will be described below in more detail with reference to the accompanying drawings. The present invention can, however, be embodied in different forms and should not be construed as limited to the exemplary embodiments set forth herein. Rather, these exemplary embodiments are provided to make this disclosure thorough and complete, and fully convey the scope of the present invention to those skilled in the art. The spirit and scope of the invention are as defined in the claims.

The terms used in this patent specification are for describing the exemplary embodiments of the present invention and they do not limit the scope of the present invention. In this specification, the use of a singular term includes a plural term as well unless mentioned otherwise. The use of an expression such as "comprises" or "comprising" a constituent element, step, or device in this patent specification does not exclude the presence or addition of another constituent element, step, or device.

When an element is described in this specification to be "connected to" or "coupled to" another element, the description includes not only a direct connection or coupling but also an indirect connection or coupling in which yet another element is interposed between them. Furthermore, when an element is described to be "directly connected to" or "directly coupled to" another element, the description means that there are no other elements interposed between them.

The expression 'and/or' means each of the mentioned items, and all combinations of one or more of the mentioned items.

When a first layer is referred to as being "on" a second layer or "on" a substrate, it not only refers to a case in which the first layer is formed directly on the second layer or the substrate, but also a case in which a third layer exists between the first layer and the second layer or the substrate.

The terms "below", "beneath", "lower", "above", and "upper" are spatially relative words, and those terms may be used to easily describe the correlation between an element or constituent element and another element or constituent element in the drawings. The spatially relative words have to be construed to include not only the direction illustrated in the drawings but also the different directions when the element is used or operates. For example, when a drawing is reversed, an element that is described to be "below" or "beneath" another element can be disposed above the element.

Additionally, the exemplary embodiments of the present invention described in this specification are described with reference to the exemplary drawings that are cross-sectional views or plane views. The drawings are not necessarily to scale and in some instances, proportions may be exaggerated to clearly illustrate features of an exemplary embodiments. Therefore, the forms of the exemplary drawings can be changed due to a fabrication method or tolerance. In this respect, the exemplary embodiments of the present invention are not limited to the specific forms illustrated in the drawings, but include a variation in the shape formed according to the fabrication process. For example, a region illustrated to have a right angle can be of a shape having a rounded portion or a predetermined curvature. Therefore, the regions shown in the drawings are roughly illustrated, and the shapes of the regions exemplarily illustrated in the drawings just show specific shapes of the regions of an element and do not limit the scope of the present invention.

Throughout the disclosure, like reference numerals refer to like parts throughout the various figures and exemplary embodiments of the present invention. Therefore, the reference numerals can be referred to and described, although they are not mentioned or described in the corresponding drawing. Also, even though a reference numeral does not appear in the corresponding drawing, the constituent element of the reference numeral can be described by referring to other drawings.

Figure 2:
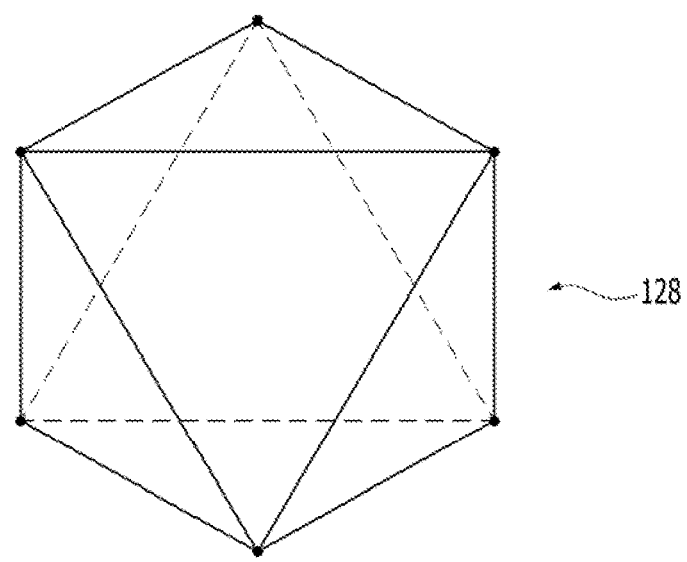
FIG. 2 illustrates a nano void in accordance with an exemplary embodiment of the present invention.

FIG. 1 is a cross-sectional view illustrating a structure of an image sensor in accordance with an embodiment of the present invention. FIG. 2 illustrates a nano void in accordance with an embodiment of the present invention.

Referring to FIGS. 1 and 2, the image sensor in accordance with an exemplary embodiment of the present invention may include a substrate 21, a first photodiode 41, a second photodiode 42, a third photodiode 43, and nano void regions 121. Each of the first photodiode 41, the second photodiode 42, and the third photodiode 43 may include a first N-type impurity region 31 and a second N-type impurity region 32. Each of the nano void regions 121 may include a first portion 123 and a second portion 124. Each of the nano void region 121 can include a plurality of nano voids 128. For example, each of the nano voids 128 may be octahedron in shape.

The density of the nano voids 128 in the first portion 123 may be greater than the density of the nano voids 128 in the second portion 124.

Each of the nano voids 128 may be understood to be a nano cavity.

The substrate 21 may be a semiconductor substrate such as a silicon wafer. For example, the substrate 21 may include a mono-crystalline silicon that includes a P-type impurity. The first photodiode 41, the second photodiode 42, and the third photodiode 43 may be formed by implanting impurity ions into the substrate 21. The concentration of the N-type impurity of the first N-type impurity regions 31 may be greater than the concentration of the N-type impurity of the second N-type impurity regions 32. The second N-type impurity regions 32 may be disposed underneath and contiguous with the first N-type impurity regions 31. The second N-type impurity regions 32 may be thicker than the first N-type impurity regions 31. The substrate 21 may be located underneath and between the first photodiode 41, the second photodiode 42, and the third photodiode 43, so that the substrate 121 surrounds the first photodiode 41, the second photodiode 42, and the third photodiode 43. The lower ends of the second N-type impurity regions 32 may be physically connected to the substrate 21. The first photodiode 41, the second photodiode 42, and the third photodiode 43 may be spaced apart from each other by the substrate 21 and nano void regions 121.

The nano void regions 121 may be formed between the first photodiode 41, the second photodiode 42, and the third photodiode 43 and on the external sides of them. For example, the nano void regions 121 may be formed in the substrate 21 between the first photodiode 41, the second photodiode 42, and the third photodiode 43 and on the external sides of the first photodiode 41, the second photodiode 42, and the third photodiode 43. The nano void regions 121 may include the nano voids 128 that are formed via an ion implantation process using at least one of hydrogen (H) ions, helium ions (He), or a combination thereof. The ion implantation process for forming the nano voids 128, can include various ion implantation energy levels and doses.

Each of the nano void regions 121 may be formed in proximity to the sides of each of the first photodiode 41, the second photodiode 42, and the third photodiode 43. The upper ends of the nano void regions 121 may be lower than the upper ends of the first photodiode 41, the second photodiode 42, and the third photodiode 43. The substrate 21 may cover the upper portions of the nano void regions 121. The lower ends of the nano void regions 121 may be lower than the lower ends of the first photodiode 41, the second photodiode 42, and the third photodiode 43.

The first portions 123 of the nano void regions 121 may be formed in proximity to the first N-type impurity regions 31, and the second portions 124 of the nano void regions 121 may be formed in proximity to the second N-type impurity regions 32. The interfaces 123B between the first portions 123 and the second portions 124 may be disposed on substantially the same horizontal line as the interfaces 31B between the first N-type impurity regions 31 and the second N-type impurity regions 32. The second portions 124 may be disposed underneath and contiguous with the first portions 123. The upper ends of the first portions 123 may be disposed lower than the upper ends of the first N-type impurity regions 31. The lower ends of the second portions 124 may be disposed lower than the lower ends of the second N-type impurity regions 32.

FIGS. 3 to 9 are cross-sectional views illustrating structures of image sensors in accordance with alternative exemplary embodiments of the present invention.

Figure 3:
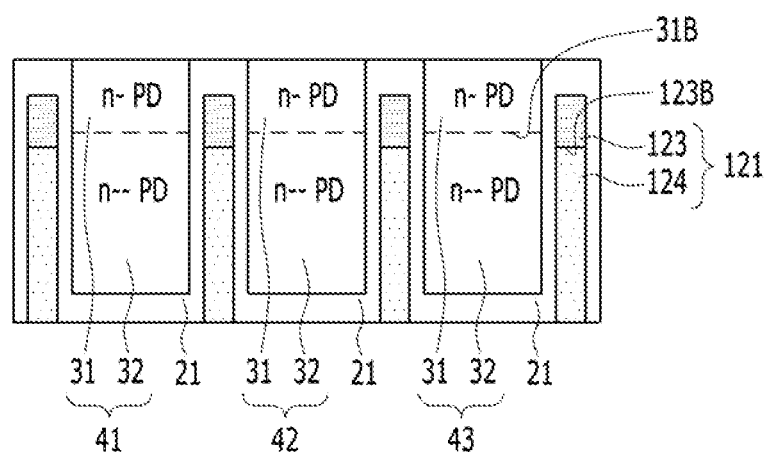
FIGS. 3 to 9 are cross-sectional views illustrating a structure of an image sensor in accordance with exemplary embodiments of the present invention.

Referring to FIG. 3, the interfaces 1238 between the first portions 123 and the second portions 124 of the nano void regions 121 may be disposed lower than the interfaces 31B between the first N-type impurity regions 31 and the second N-type impurity regions 32. The lower ends of the first portions 123 may be disposed lower than the lower ends of the first N-type impurity regions 31. The upper ends of the second portions 124 may be disposed lower than the upper ends of the second N-type impurity regions 32.

Figure 4:
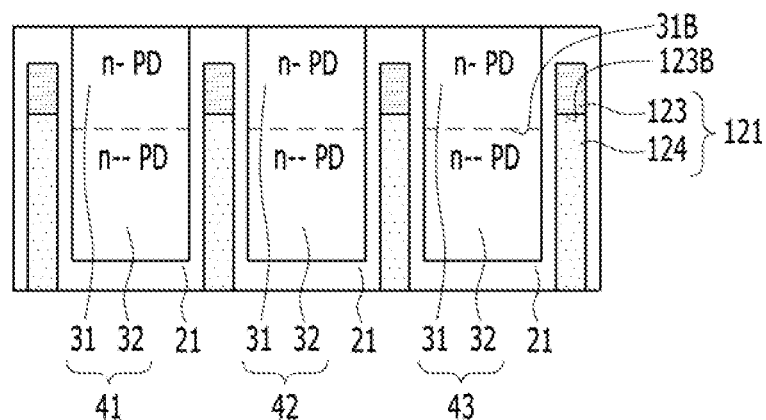

Referring to FIG. 4, the interfaces 1238 between the first portions 123 and the second portions 124 of the nano void regions 121 may be disposed higher than the interfaces 31B between the first N-type impurity regions 31 and the second N-type impurity regions 32. The lower ends of the first portions 123 may be disposed higher than the lower ends of the first N-type impurity regions 31. The upper ends of the second portions 124 may be disposed higher than the upper ends of the second N-type impurity regions 32.

Figure 5:
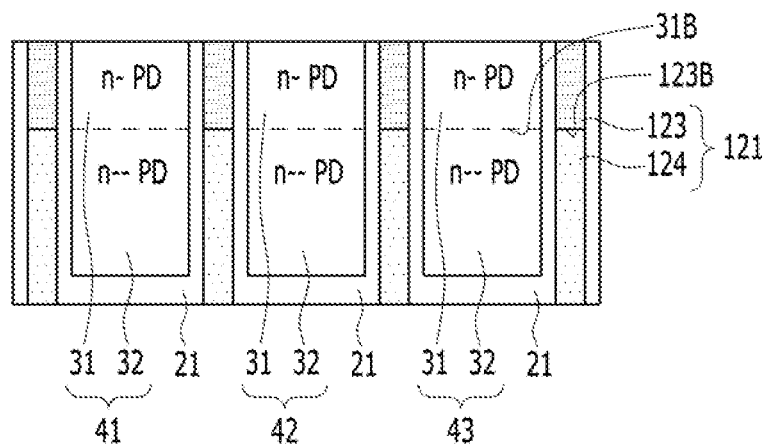

Referring to FIG. 5, the upper ends of the nano void regions 121 may be disposed at substantially the same level as the upper ends of the first photodiode 41, the second photodiode 42, and the third photodiode 43. The upper ends of the first portions 123 of the nano void regions 121 may be disposed at substantially the same level as the upper ends of the first photodiode 41, the second photodiode 42, and the third photodiode 43.

Figure 6:
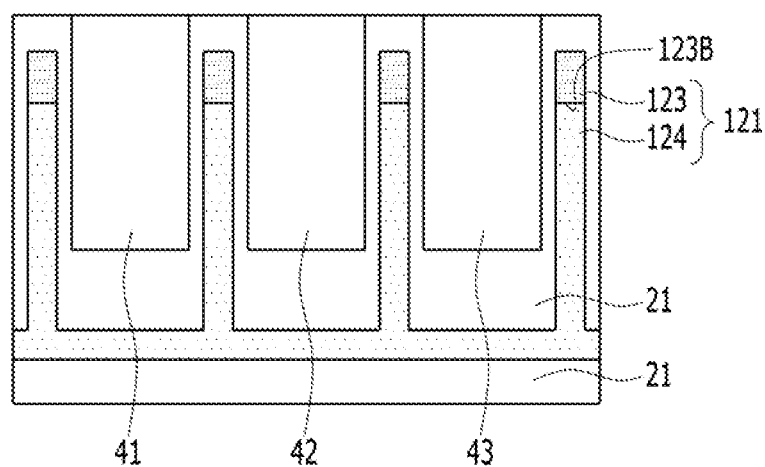

Referring to FIG. 6, the nano void regions 121 may be contiguously formed under the lower ends of the first photodiode 41, the second photodiode 42, and the third photodiode 43. The second portions 124 of the nano void regions 121 may be physically connected to each other under the lower ends of the first photodiode 41, the second photodiode 42, and the third photodiode 43. The substrate 21 may be located under the lower ends of the second portions 124. The substrate 21 may be disposed under the lower ends of the first photodiode 41, the second photodiode 42, and the third photodiode 43 and interposed between the second portions 124.

Figure 7:
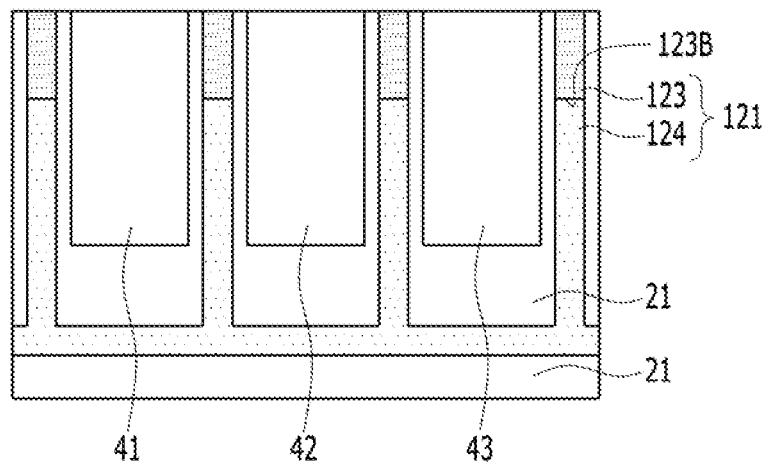

Referring to FIG. 7, the upper ends of the first portions 123 of the nano void regions 121 may be disposed at substantially the same level as the upper ends of the first photodiode 41, the second photodiode 42, and the third photodiode 43. The second portions 124 of the nano void regions 121 may be contiguously formed beneath the first photodiode 41, the second photodiode 42, and the third photodiode 43.

Figure 8:
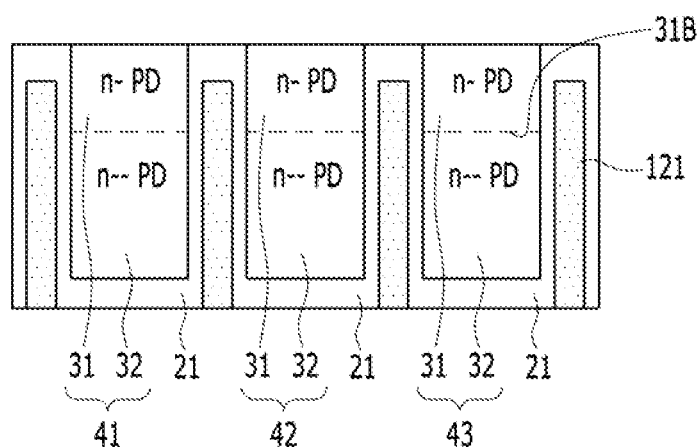

In an exemplary embodiment of FIG. 8, the nano voids 128 (refer to FIG. 2) in the nano void regions 121 may be formed at a substantially uniform density. The nano void regions 121 may be spaced apart from the sides of the first photodiode 41, the second photodiode 42, and the third photodiode 43. The substrate 21 may be interposed between the sides of the first photodiode 41, the second photodiode 42, and the third photodiode 43 and between the nano void regions 121. The upper ends of the nano void regions 121 may be disposed lower than the upper ends of the first photodiode 41, the second photodiode 42, and the third photodiode 43 and the upper end of the substrate 21. The substrate 21 may cover the upper portions of the nano void regions 121.

According to the exemplary embodiment of the present invention, the nano void regions 121 may include a plurality of regions that are spaced apart from each other. On the other hand, the nano void regions 121 may be formed in a onebody type. In other words, all of the nano void regions 121 may be formed as an integrated unit.

Figure 9:
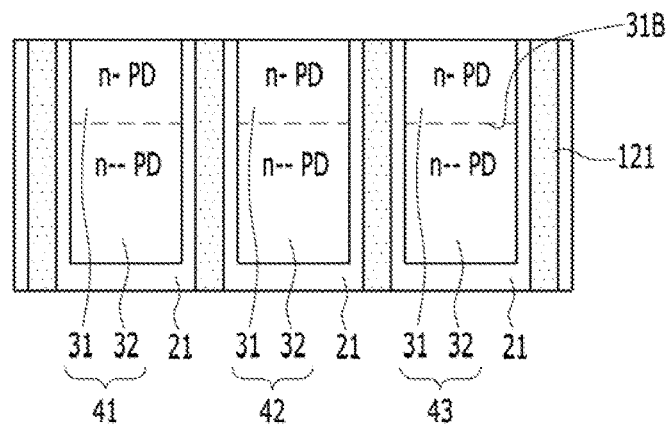

In an exemplary embodiment of FIG. 9, the nano voids 128 (refer to FIG. 2) in the nano void regions 121 may be formed in a substantially uniform density. The nano void regions 121 may penetrate through the substrate 21. The substrate 21 may be interposed between the sides of the first photodiode 41, the second photodiode 42, and the third photodiode 43 and between the nano void regions 121. The upper ends of the nano void regions 121, the upper ends of the first photodiode 41, the second photodiode 42, and the third photodiode 43, and the upper end of the substrate 21 may be disposed on substantially the same plane.

Figure 10:
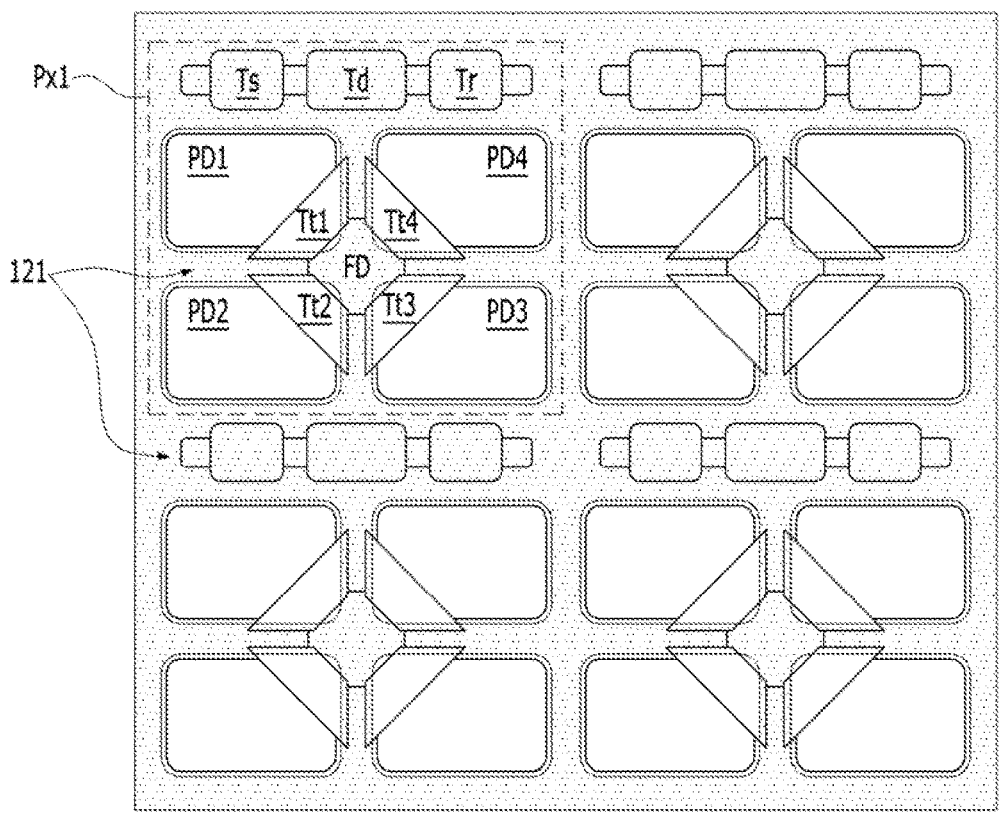
FIGS. 10 and 11 are layouts illustrating an image sensor in accordance with an exemplary embodiment of the present invention.
Figure 11:
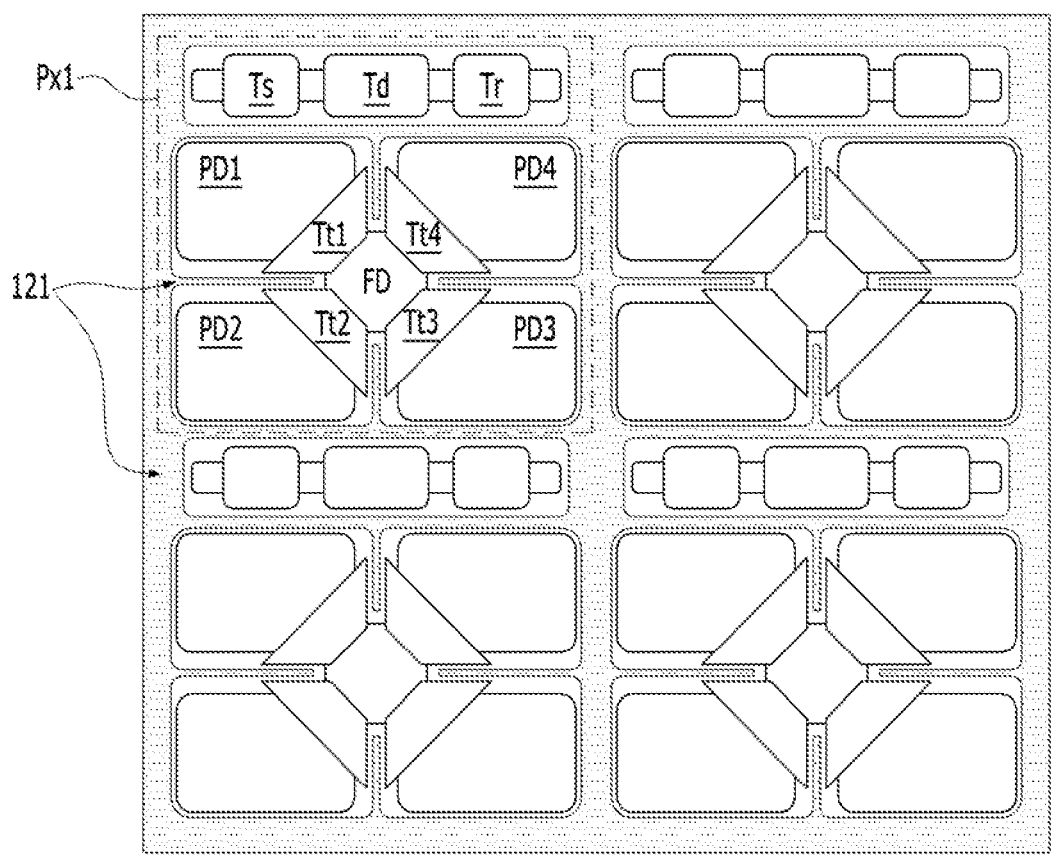

FIGS. 10 and 11 are layouts illustrating an image sensor in accordance with an exemplary embodiment of the present invention. Referring to FIG. 10, the image sensor in accordance with the exemplary embodiment of the present invention may include a plurality of pixels Px1 that are arranged in two dimensions in a row direction and a column direction. Each of the pixels Px1 may include, for example, a first photodiode PD1, a second photodiode PD2, a third photodiode PD3, a fourth photodiode PD4, a first transfer transistor Tt1, a second transfer transistor Tt2, a third transfer transistor Tt3, a fourth transfer transistor Tt4, a floating diffuser FD, a reset transistor Tr, a drive transistor Td, and a select transistor Ts. As shown in FIGS. 10 and 11, each of the first photodiode PD1, the second photodiode PD2, the third photodiode PD3, and the fourth photodiode PD4 may be surrounded by a nano void region 121. As shown in FIG. 10, each of the pixels Px1 may be surrounded by the nano void region 121. The nano void regions 121 may be formed in a onebody type.

The image sensor in accordance with the exemplary embodiment of the present invention may have a 4 shared pixel structure. In alternative embodiment of the present invention, the image sensor may have at least one of a two shared pixel structure, a three shared pixel structure, a four shared pixel structure, an N shared pixel structure, or combinations thereof.

According to the exemplary embodiment of the present invention, it may be understood that the nano void region 121 may be formed on the border of the pixels Px1 and extend into the space between the first to fourth photodiodes PD1, PD2, PD3 and PD4.

Referring to FIG. 11, the nano void region 121 may surround the sides of the first photodiode PD1, the second photodiode PD2, the third photodiode PD3, and the fourth photodiode PD4. As shown in FIG. 11, the first transfer transistor Tt1, the second transfer transistor Tt2, the third transfer transistor Tt3, the fourth transfer transistor Tt4, the floating diffuser FD, the reset transistor Tr, the drive transistor Td, and the select transistor Ts may be formed to be spaced apart from the nano void region 121 by the substrate.

According to an alternative exemplary embodiment of the present invention, the nano void region 121 may include discontinuous patterns.

FIGS. 12 to 23 are cross-sectional views illustrating a structure of an image sensor and a method for fabricating the image sensor in accordance with exemplary embodiment of the present invention.

Figure 12:
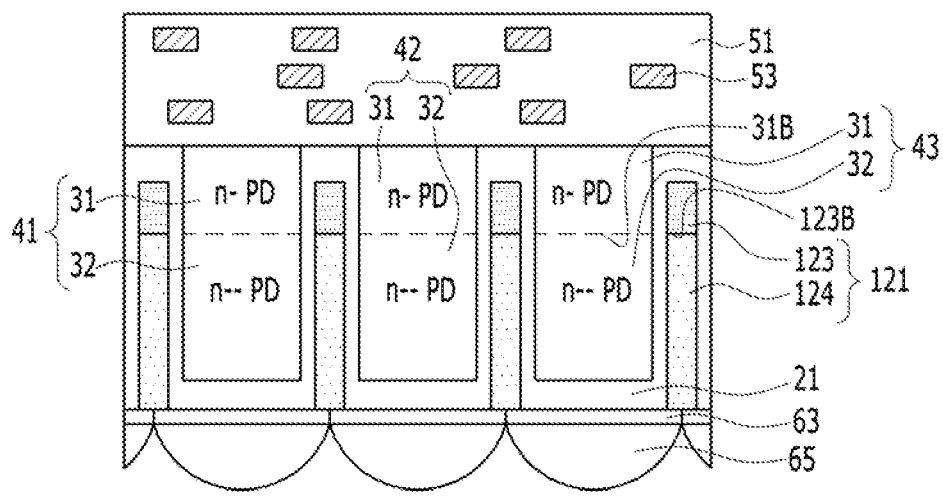
FIGS. 12 to 23 are cross-sectional views illustrating structure of an image sensor and a method for fabricating the image sensor in accordance with exemplary embodiment of the present invention.

Referring to FIG. 12, the image sensor in accordance with an embodiment of the present invention may include a substrate 21, a first photodiode 41, a second photodiode 42, a third photodiode 43, nano void regions 121, a first insulation layer 51, lines 53, a color filter layer 63, and a micro lens layer 65. Each of the first photodiode 41, the second photodiode 42, and the third photodiode 43 may include a first N-type impurity region 31 and a second N-type impurity region 32. Each of the nano void regions 121 may include a first portion 123 and a second portion 124.

The first insulation layer 51 may be formed over the substrate 21. Lines 53 may be formed in the first insulation layer 51. The first insulation layer 51 may cover the first photodiode 41, the second photodiode 42, and the third photodiode 43. The first insulation layer 51 may include at least one of a silicon oxide, a silicon nitride, a silicon oxynitride, low-K dielectrics, or a combination thereof. The lines 53 may include a conductive layer having at least one of polysilicon, a metal, a metal nitride, a metal silicide, conductive carbon, or a combination thereof. The combination of the first insulation layer 51 and the lines 53 may be referred to as a line layer.

The substrate 21 may be located between the first photodiode 41, the second photodiode 42, and the third photodiode 43 and on the external sides of them. The upper ends of the first photodiode 41, the second photodiode 42, and the third photodiode 43 and the upper ends of the nano void regions 121 may be disposed on substantially the same plane. The upper ends of the nano void regions 121 may be disposed lower than the upper ends of the first photodiode 41, the second photodiode 42, and the third photodiode 43. The substrate 21 may be interposed between the upper ends of the nano void regions 121 and the first insulation layer 51. For example, the substrate 21 may be interposed between the first portions 123 of the nano void regions 121 and the first insulation layer 51.

According to the exemplary embodiment of the present invention, the substrate 21 may cover the upper portion and sides of the first portions 123. The first portions 123 may be formed to be spaced apart from the transistors Tt1, Tt2, Tt3, Tt4, Tr, Td and Ts and the floating diffuser FD. For example, the substrate 21 may be interposed between the first portions 123 and the floating diffuser FD. The color filter layer 63 may be formed on the back side of the substrate 21. The micro lens layer 65 then may be formed over the color filter layer 63.

The image sensor in accordance with the exemplary embodiment of the present invention may be a back side illumination (BSI) image sensor. In accordance with the exemplary embodiment of the present invention, a logic circuit, including the lines 53, can be formed in the first insulation layer 51. The first photodiode 41, the second photodiode 42, and the third photodiode 43 form an image sensor. The image sensor in accordance with the exemplary embodiment of the present invention may be a stack sensor using a technology of bonding a logic circuit and a sensor. The nano void regions 121 may control the contamination of heavy metal that may occur in the course of bonding the logic circuit and the sensor. The nano void regions 121 may continuously control the contamination of heavy metals throughout the lifespan of the image sensor.

Figure 13:
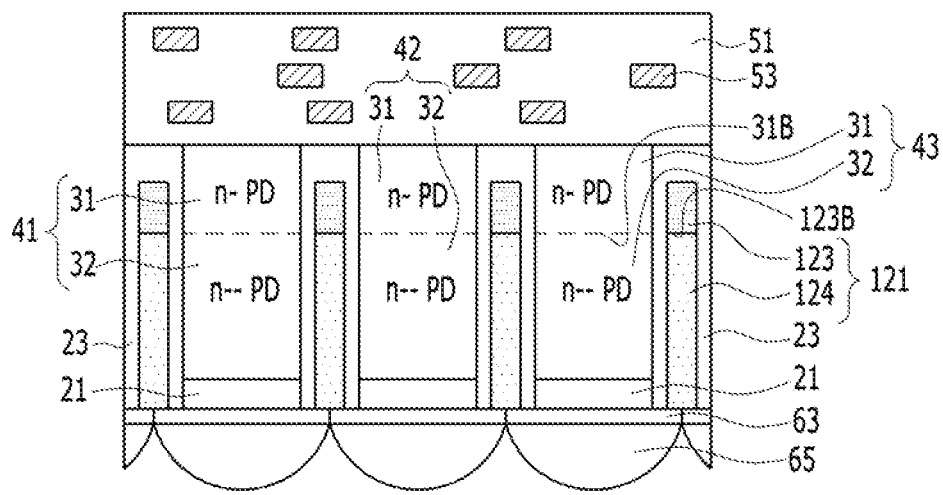

Referring to FIG. 13, in an exemplary embodiment, isolation layers 23 may be formed in the substrate 21. The isolation layers 23 may be a Deep Trench Isolation. The isolation layers 23 may include an insulation layer including at least one of a silicon oxide layer, a silicon nitride layer, a silicon oxynitride layer, or a combination thereof. The isolation layers 23 may be formed between the first photodiode 41, the second photodiode 42, and the third photodiode 43, and on the external sides of them. The nano void regions 121 may be formed in the isolation layers 23.

The upper ends of the first photodiode 41, the second photodiode 42, and the third photodiode 43 and the upper ends of the isolation layers 23 may be disposed on substantially the same plane. The upper ends of the nano void regions 121 may be lower than the upper ends of the first photodiode 41, the second photodiode 42, and the third photodiode 43. The isolation layers 23 may be located between the upper ends of the nano void regions 121 and the first insulation layer 51. For example, the isolation layers 23 may be retained between the first portions 123 of the nano void regions 121 and the first insulation layer 51.

Figure 14:
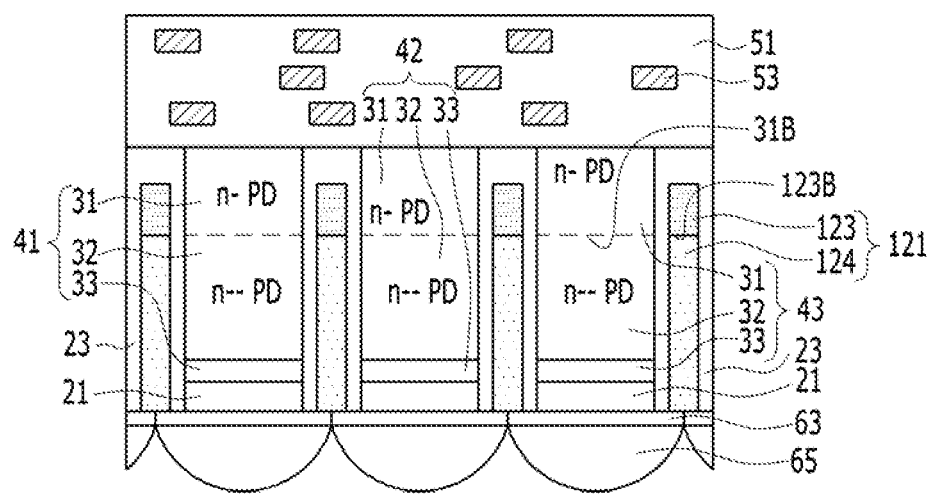

Referring to FIG. 14, each of the first photodiode 41, the second photodiode 42, and the third photodiode 43 may include the first N-type impurity region 31, the second N-type impurity region 32, and a P-type impurity region 33. The P-type impurity region 33 may include a P-type impurity. For example, the P-type impurity region 33 may include a semiconductor layer such as a mono-crystalline silicon layer that is formed by implanting a P-type impurity into the substrate 21.

The P-type impurity regions 33 may be disposed underneath and contiguous with the lower ends of the second N-type impurity regions 32. The P-type impurity regions 33 may directly contact the second N-type impurity regions 32. The substrate 21 may be interposed between the P-type impurity regions 33 and the color filter layer 63.

Figure 15:
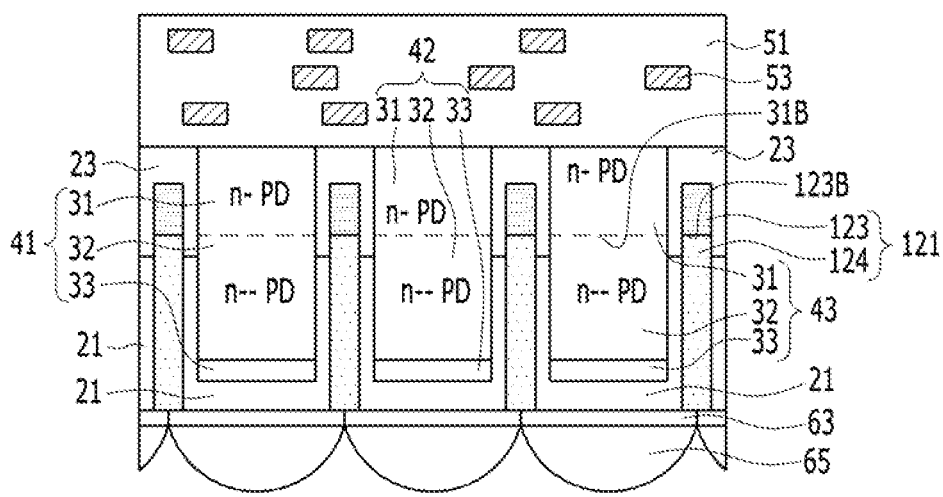

Referring to FIG. 15, the lower end of the isolation layer 23 may be disposed higher than the lower ends of the nano void regions 121. The isolation layers 23 may be a shallow Trench Isolation. The lower ends of the isolation layers 23 may be disposed higher than the lower ends of the first photodiode 41, the second photodiode 42, and the third photodiode 43. The substrate 21 may be interposed between the isolation layer 23 and the color filter layer 63. The upper ends of the nano void regions 121 (including the first portions 123) may be disposed in the isolation layers 23.

Figure 16:
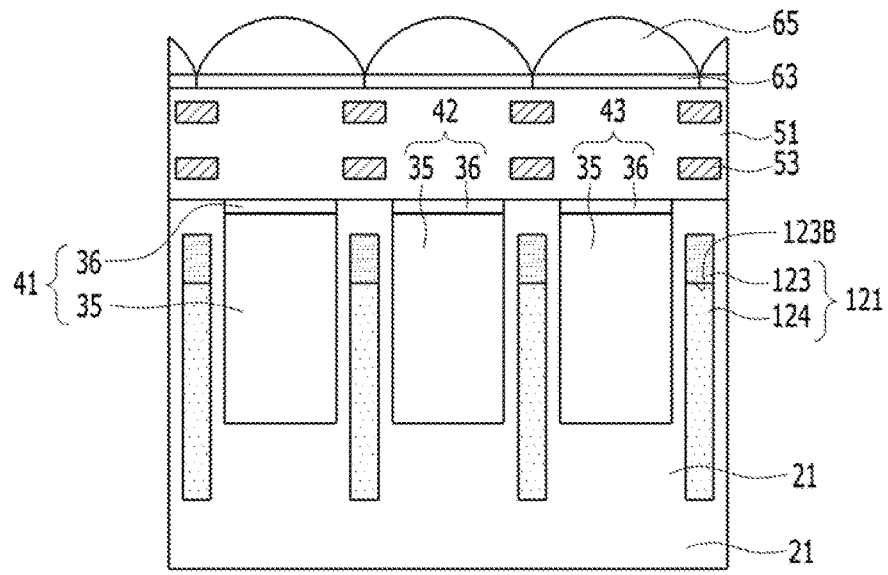

Referring to FIG. 16, the image sensor in accordance with an exemplary embodiment of the present invention may include a substrate 21, a first photodiode 41, a second photodiode 42, a third photodiode 43, nano void regions 121, a first insulation layer 51, lines 53, a color filter layer 63, and a micro lens layer 65. Each of the first photodiode 41, the second photodiode 42, and the third photodiode 43 may include an N-type impurity region 35 and a P-type impurity region 36.

The P-type impurity regions 36 may be formed over and contiguous with the N-type impurity regions 35. The color filter layer 63 may be formed over the first insulation layer 51. The micro lens layer 65 may be formed over the color filter layer 63. The P-type impurity regions 36 may be interposed between the first insulation layer 51 and the N-type impurity regions 35. The upper ends of the nano void regions 121 may be disposed lower than the upper ends of the N-type impurity regions 35.

Figure 17:
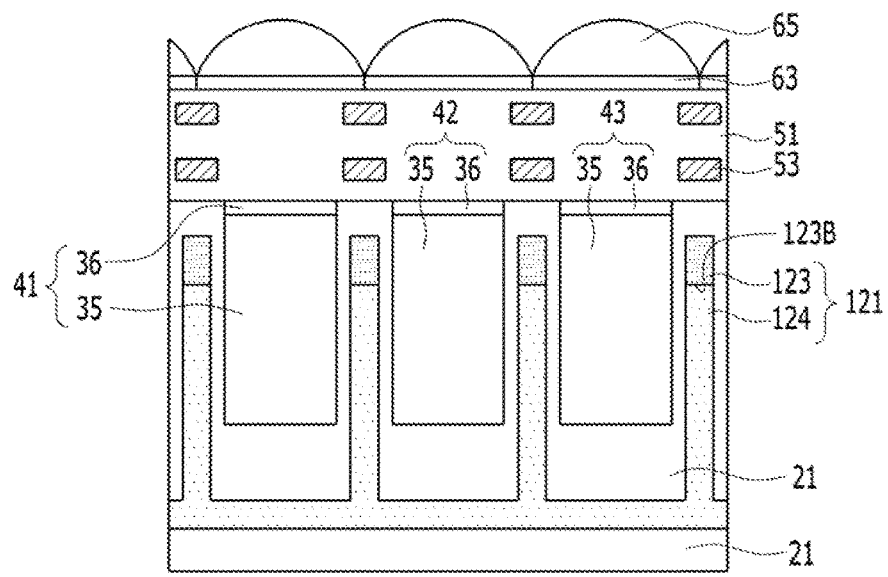

Referring to FIG. 17, in an alternative exemplary embodiment, each of the first photodiode 41, the second photodiode 42, and the third photodiode 43 may include the N-type impurity region 35 and the P-type impurity region 36. In this exemplary embodiment, portions of the substrate 21 can be retained below the first photodiode 41, the second photodiode 42, and the third photodiode 43. The second portions 124 of the nano void regions 121 may be formed to extend below the portions of the substrate 21 retained below the first photodiode 41, the second photodiode 42, and the third photodiode 43 and to integrally connect together.

Figure 18:
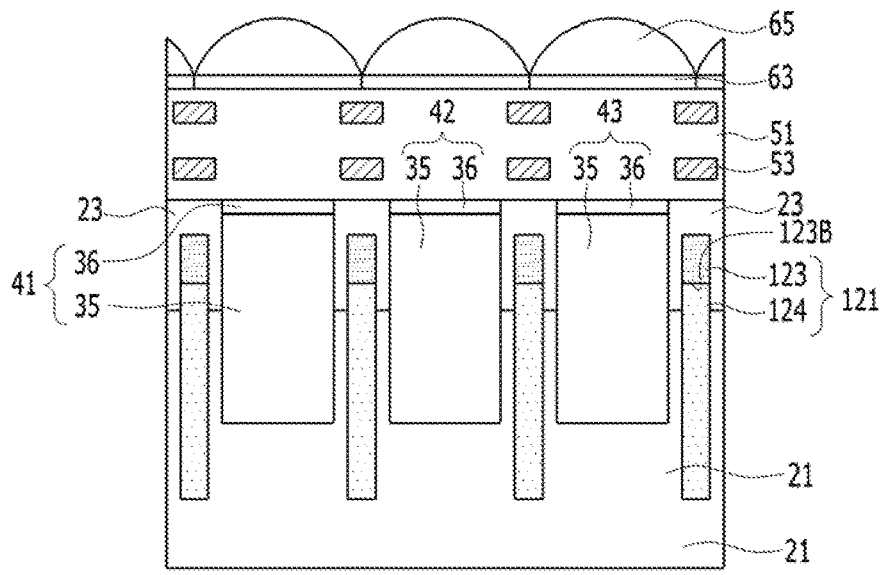

Referring to FIG. 18, in an exemplary embodiment, isolation layers 23 may be formed in the substrate 21. The lower ends of the isolation layers 23 may be disposed higher than the lower ends of the nano void regions 121.

Figure 19:
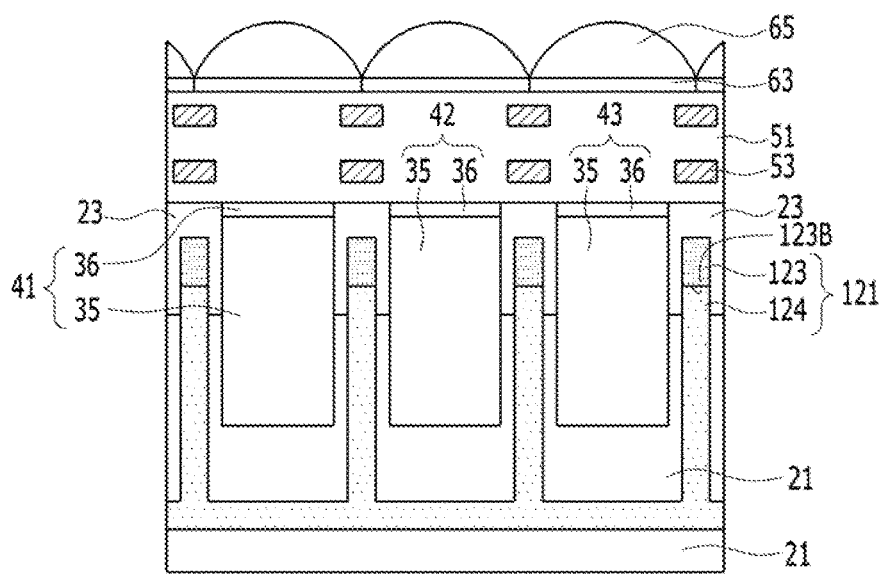

In the exemplary embodiment of FIG. 19, the lower ends of the isolation layers 23 may be disposed higher than the lower ends of the nano void regions 121. Portions of the substrate 21 can be retained below the first photodiode 41, the second photodiode 42, and the third photodiode 43. The second portions 124 of the nano void regions 121 can be formed to extend below the portions of the substrate 21 retained below the first photodiode 41, the second photodiode 42, and the third photodiode 43 and to integrally connect together.

Figure 20:
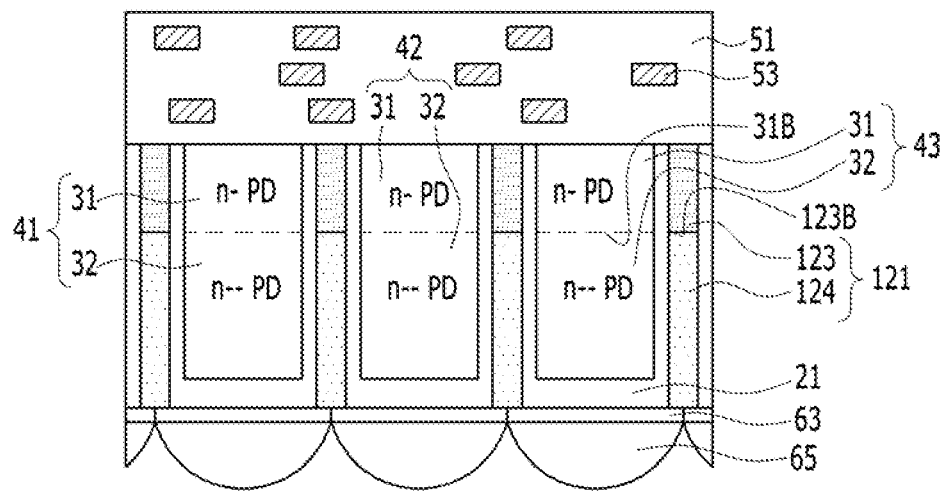

In the exemplary embodiment of FIG. 20, the upper ends of the nano void regions 121 may be disposed at substantially the same level as the upper ends of the first photodiode 41, the second photodiode 42, and the third photodiode 43. The first insulation layer 51 may be formed over the substrate 21. The lines 53 may be formed in the first insulation layer 51. The color filter layer 63 may be formed on the back side of the substrate 21, and the micro lens layer 65 may be formed over the color filter layer 63.

Figure 21:
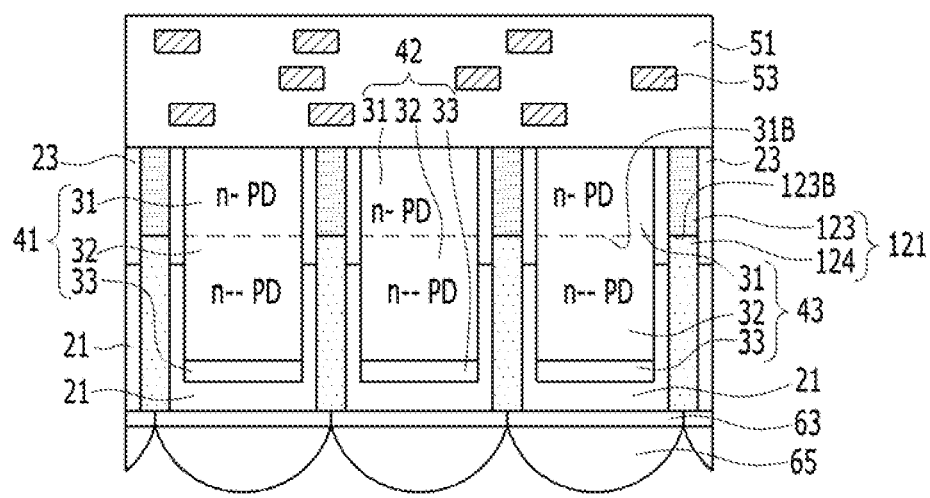

In the exemplary embodiment of FIG. 21, the nano void regions 121 may penetrate through the isolation layer 23. Each of the first photodiode 41, the second photodiode 42, and the third photodiode 43 may include a first N-type impurity regions 31, a second N-type impurity regions 32, and a P-type impurity region 33.

Figure 22:
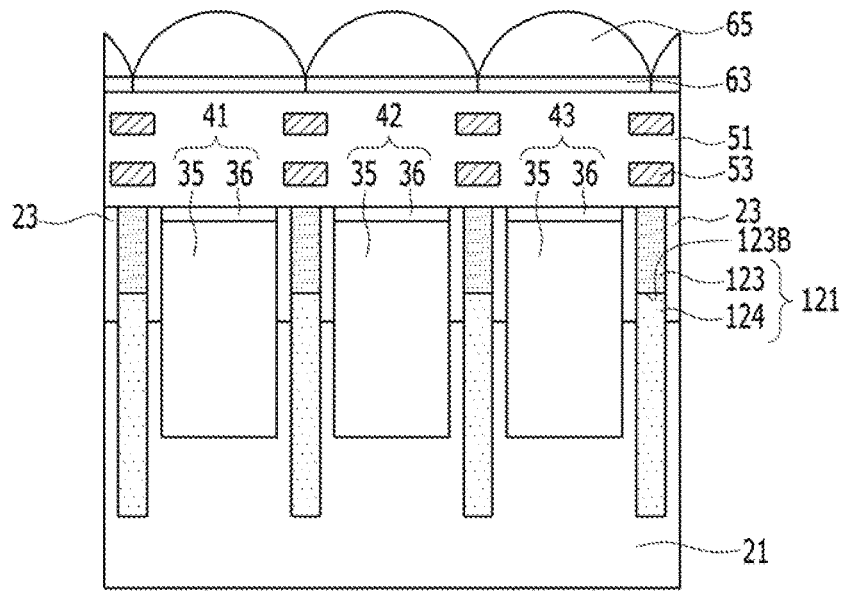

In the exemplary embodiment of FIG. 22, the nano void regions 121 may penetrate through the isolation layer 23. Each of the first photodiode 41, the second photodiode 42, and the third photodiode 43 may include an N-type impurity region 35 and a P-type impurity region 36.

Figure 23:
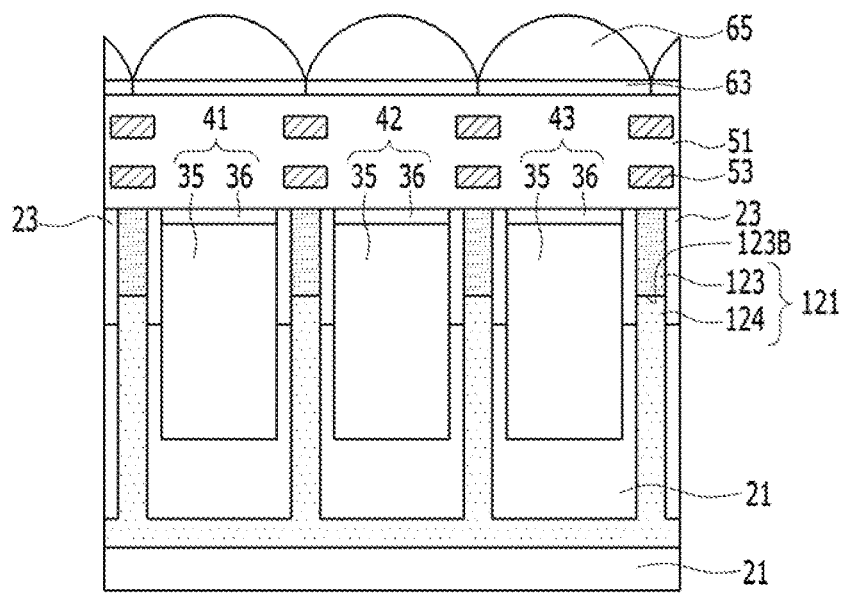

In the exemplary embodiment of FIG. 23, the nano void regions 121 may penetrate through the isolation layer 23. Portions of the substrate 21 can be retained below the first photodiode 41, the second photodiode 42, and the third photodiode 43. The second portions 124 of the nano void regions 121 can be formed to extend below the portions of the substrate 21 retained below the first photodiode 41, the second photodiode 42, and the third photodiode 43 and to integrally connect together.

FIGS. 24 to 28 are cross-sectional views illustrating a method for fabricating an image sensor in accordance with an exemplary embodiment of the present invention.

Figure 24:
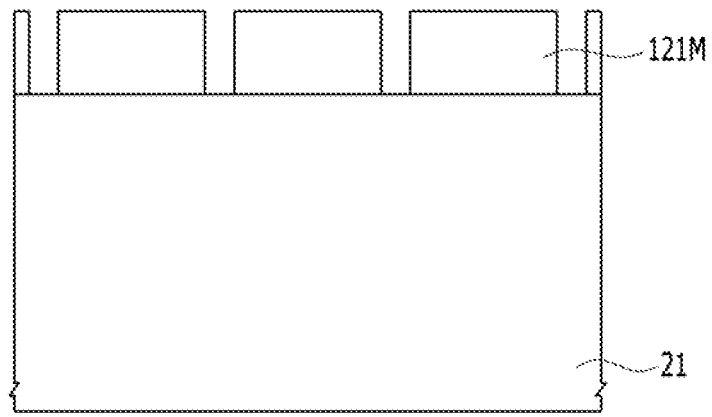
FIGS. 24 to 28 are cross-sectional views illustrating a method for fabricating an image sensor in accordance with an exemplary embodiment of the present invention.

Referring to FIG. 24, a mask layer 121M may be formed over a substrate 21. The mask layer 121M may be at least one of a photoresist pattern, a hard mask pattern, or a combination thereof. Before the mask layer 121M is formed, other constituent elements, such as the isolation layer 23, may be formed in the substrate 21. However, a description of the other constituent elements is omitted, herein, to simplify the description of the exemplary embodiment of the present invention.

Figure 25:
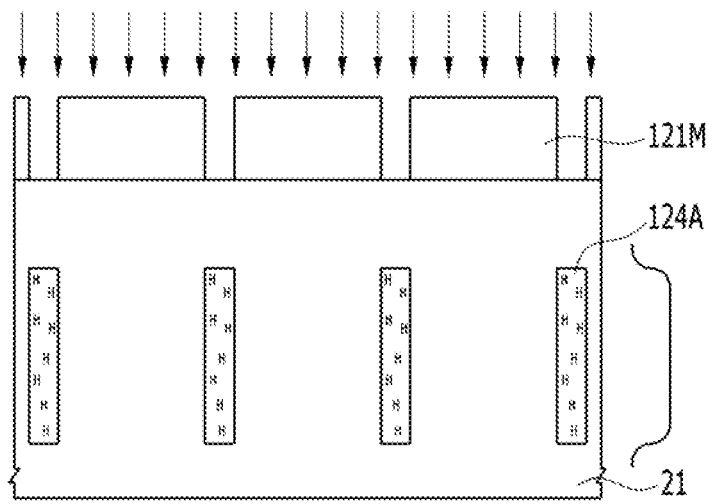

Referring to FIG. 25, lower ion-implanted regions 124A may be formed in the substrate 21 by using the mask layer 121M as an ion implantation mask and performing a first ion implantation process. The first ion implantation process may be performed by using at least one of hydrogen (H), helium (He), or a combination thereof as an ion implantation source. The ion concentration and implantation energy can be varied to produce a required ion concentration at a specific depth in the substrate. The lower ion-implanted regions 124A may include at least one of hydrogen (H) ions, helium (He) ions, or a combination thereof.

Figure 26:
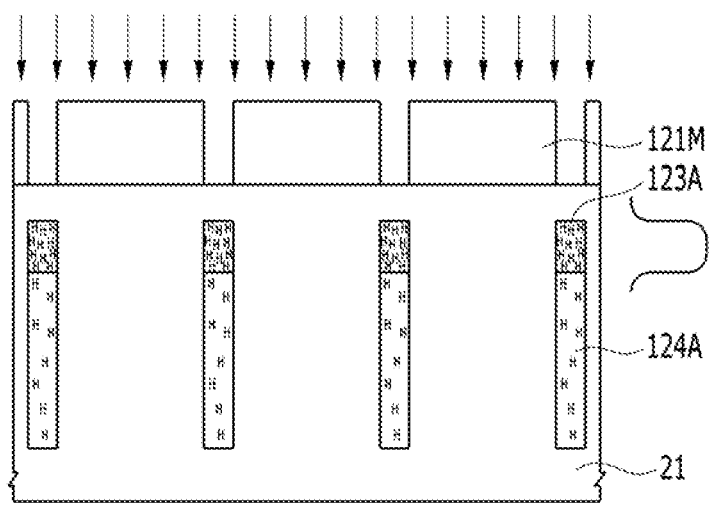

Referring to FIG. 26, upper ion-implanted regions 123A may be formed in the substrate 21 by using the mask layer 121M as an ion implantation mask and performing a second ion implantation process. The second ion implantation process may be performed by using at least one of hydrogen (H), helium (He), or a combination thereof as an ion implantation source. The ion concentration and implantation energy can be varied to produce a required ion concentration at a specific depth in the substrate. The upper ion-implanted regions 123A may include at least one of hydrogen (H) ions, helium (He) ions, or a combination thereof. The ion concentration of the upper ion-implanted regions 123A can be greater than the ion concentration of the lower ion-implanted regions 124A. Alternatively, the ion concentration of the upper ion-implanted regions 123A can be substantially the same as the ion concentration of the lower ion-implanted regions 124A. The upper ion-implanted regions 123A may be formed over the lower ion-implanted regions 124A.

According to an exemplary embodiment of the present invention, the first ion implantation process and the second ion implantation process may be alternately repeated to form each of the upper ion-implanted regions 123A and each of the lower ion-implanted regions 124A. Alternatively either of the upper ion-implanted regions 123A or the lower ion-implanted regions 124A can be completely formed first, and the remaining ion-implanted regions formed next.

In the first ion implantation process and the second ion implantation process, the concentration of the ions that are implanted into the substrate 21 may be controlled to be different based on the depth of the substrate 21 and by using different ion implantation energies.

According to an exemplary embodiment of the present invention, the at least one of hydrogen (H) ions, helium (He) ions, or a combination thereof may be implanted into all of the upper ion-implanted regions 123A and the lower ion-implanted regions 124A through a single ion implantation process, such as the first ion implantation process.

Figure 27:
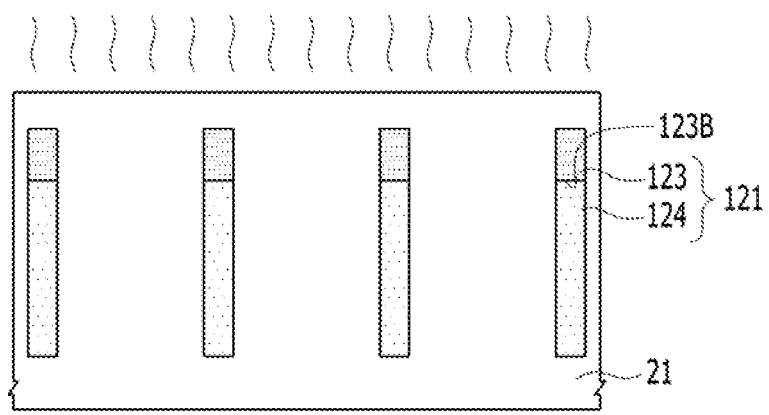

Referring to FIG. 27, the mask layer 121M is removed. The nano void regions 121, including a plurality of nano voids (refer to "128" of FIG. 2), may be formed by performing a thermal treatment. During the thermal treatment, the ions that are implanted into the upper ion-implanted regions 123A and the lower ion-implanted regions 124A may be diffused to the outside (Out Diffusion) and as a result, the nano voids (refer to "128" of FIG. 2) are be formed. Each of the nano void regions 121 may include a first portion 123 and a second portion 124 that respectively correspond to the upper ion-implanted regions 123A and the lower ion-implanted regions 124A. The density of the nano voids (refer to "128" of FIG. 2) in the first portions 123 can be greater than the density of the nano voids in the second portions 124. Alternatively, the density of the nano voids in the first regions 123 can be substantially the same as the density of nano voids in the second regions 124.

According to an exemplary embodiment of the present invention, each of the nano voids (refer to "128" of FIG. 2) may be generally octahedron in shape. While the thermal treatment is performed, lattice damage that is caused in the substrate 21 during the ion implantation process may be repaired.

According to another exemplary embodiment of the present invention, the thermal treatment may be omitted. The substrate 21 may be exposed to high-temperature atmosphere while several other subsequent processes, such as a process of forming a dielectric layer, are performed. While the substrate 21 is exposed to the high-temperature atmosphere, the ions that are implanted into the upper ion-implanted regions 123A and the lower ion-implanted regions 124A may be diffused to the outside (Out Diffusion) and as a result, the nano voids (refer to "128" of FIG. 2) are be formed.

According to another exemplary embodiment of the present invention, the upper ion-implanted regions 123A may correspond to the first portions 123, and the lower ion-implanted regions 124A may correspond to the second portions 124. The first portions 123 may be referred to as first nano void regions, and the second portions 124 may be referred to as second nano void regions.

Figure 28:
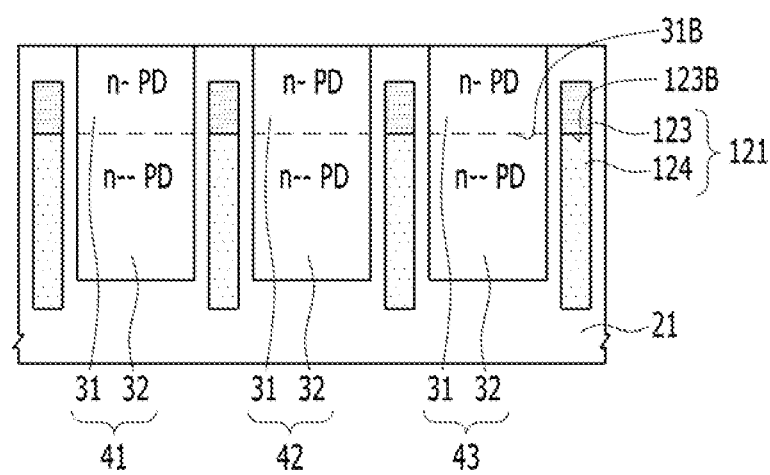

Referring to FIG. 28, the first photodiode 41, the second photodiode 42, and the third photodiode 43 may be formed in the substrate 21. Each of the first photodiode 41, the second photodiode 42, and the third photodiode 43 may include a first N-type impurity region 31 and a second N-type impurity region 32. The concentration of the N-type impurity of the first N-type impurity regions 31 may be higher than the concentration of the N-type impurity of the second N-type impurity regions 32. The first N-type impurity regions 31 may be formed in proximity to the first portions 123 of the nano void regions 121, and the second N-type impurity regions 32 may be formed in proximity to the second portions 124 of the nano void regions 121.

In accordance with the exemplary embodiment of the present invention, the first photodiode 41, the second photodiode 42, and the third photodiode 43 may be formed before the nano void regions 121 are formed. For example, the first photodiode 41, the second photodiode 42, and the third photodiode 43 may be formed before the upper ion-implanted regions 123A and the lower ion-implanted regions 124A are formed.

Referring back to FIGS. 1 to 23, the transistors Tt1, Tt2, Tt3, Tt4, Tr, Td and Ts, the floating diffuser FD, the lines 53, the color filter layer 63, and the micro lens layer 65 may be formed over the substrate 21.

According to an exemplary embodiment of the present invention, the color filter layer 63 and the micro lens layer 65 may be formed on the back side of the substrate 21. The thickness of the substrate 21 may be reduced by partially removing the back side of the substrate 21.

According to the exemplary embodiment of the present invention, the first insulation layer 51 and the lines 53 form a logic circuit. The first photodiode 41, the second photodiode 42, and the third photodiode 43 form a sensor. The image sensor in accordance with the exemplary embodiment of the present invention may be a stack sensor using a technology of bonding a logic circuit and a sensor.

According to an exemplary embodiment of the present invention, the nano void regions 121 may function as a getter that collects mobile ions. Specifically, the nano void regions 121 may function as a getter that collects heavy metal contaminants such as copper (Cu) ions, nickel (Ni) ions, iron (Fe) ions or cobalt (Co) ions. The nano void regions 121 may control the heavy metal contamination that may cause image sensor defects. The first portions 123 of the nano void regions 121 may be formed in proximity to first N-type impurity regions 31. The concentration of the N-type impurities of the first N-type impurity regions 31 may be higher than the concentration of the N-type impurities of the second N-type impurity regions 32. The density of the nano voids 128 in the first portions 123 can be greater than the density of the nano voids 128 in the second portions 124. The gettering efficiency of the first portions 123 may be superior to that of the second portions 124.

As shown in FIGS. 10 and 11, each of the photodiodes PD1, PD2, PD3 and PD4 may be surrounded by the nano void regions 121 and each of the pixels Px1 may be completely surrounded by the nano void regions 121. The nano void regions 121 may function as a getter for collecting heavy metal contamination throughout the lifespan of the image sensor. The gettering efficiency of the nano void regions 121 may be remarkably increased from that of the conventional technology.

The nano void regions 121 may reflect or block off the optical signals inputted from the exterior. The nano void regions 121 may be formed between the first photodiode 41, the second photodiode 42, and the third photodiode 43 or on the external sides of them. The nano void regions 121 may prevent crosstalk among the first photodiode 41, the second photodiode 42, and the third photodiode 43.

According to the exemplary embodiments of the present invention, nano void regions are formed between photodiodes and around the photodiodes. The nano void regions may include a plurality of nano voids that are formed using an ion implantation process to implant hydrogen (H) ions, helium (He) ions, or a combination thereof. The nano void regions may control heavy metal contamination that may lead to dark defects in the image sensor. The nano void regions may prevent crosstalk between the neighboring pixels and result in an image sensor having improved performance.

Other effects of the exemplary embodiments of the present invention that are not described herein may be understood from the detailed description of the present specification.

While the present invention has been described with respect to the specific embodiments, it will be apparent to those skilled in the art that various changes and modifications may be made without departing from the spirit and scope of the invention as defined in the following claims.

What is claimed is:

1. An image sensor, comprising:
   a plurality of photodiodes formed in a substrate;
   nano void regions formed in the substrate adjacent to sides of each photodiode of the plurality of photodiodes; and
   a plurality of nano voids formed in each nano void region of the nano void regions.

2. The image sensor of claim 1, wherein each nano void region includes a first portion and a second portion, and
   a density of the plurality of nano voids in the first portion is different than a density of the plurality of nano voids in the second portion.

3. The image sensor of claim 1, wherein each photodiode, of the plurality of photodiodes, includes a first N-type impurity region having a first concentration of an N-type impurity, and a second N-type impurity region having a second concentration of an N-type impurity that is less than the first concentration, and
   wherein each nano void region includes a first portion, having a first density of the plurality of nano voids, disposed in proximity to the first N-type impurity region, and a second portion, having a second density of the plurality of the nano voids that is less than the first density, disposed in proximity to the second N-type impurity region.

4. The image sensor of claim 3, wherein an upper end of the first portion of each nano void region is disposed lower than an upper end of the first N-type impurity region.

5. The image sensor of claim 3, wherein a lower end of the first portion of each nano void region is disposed at substantially a same level as an interface between the first N-type impurity region and the second N-type impurity region, or lower than the interface between the first N-type impurity region and the second N-type impurity region.

6. The image sensor of claim 3, wherein the second portion of each nano void region is disposed in proximity to sides of the second N-type impurity region, and a lower end of the second portion is disposed at a level below a level of a lower end of the second N-type impurity region.

7. The image sensor of claim 1, wherein the nano void regions are formed between the plurality of photodiodes.

8. The image sensor of claim 7, wherein the nano void regions surround the sides of the plurality of photodiodes.

9. The image sensor of claim 1, wherein the nano void regions are formed spaced apart from the plurality of photodiodes.

10. The image sensor of claim 1, wherein the nano void regions are formed spaced apart from an upper surface or a lower surface of the substrate.

11. The image sensor of claim 1, further comprising:
    an isolation layer in the substrate disposed between the plurality of photodiodes,
    wherein at least a portion of each nano void region, of the nano void regions, is formed in the isolation layer.

12. The image sensor of claim 1, wherein the nano void regions surround the plurality of photodiodes.

13. An image sensor, comprising:
    a plurality of photodiodes formed in a substrate;
    nano void regions formed in the substrate adjacent to sides of each photodiode of the plurality of photodiodes;
    a plurality of nano voids formed in each nano void region of the nano void regions;
    a color filter layer disposed over the plurality of photodiodes; and
    a micro lens layer disposed over the color filter layer.

14. The image sensor of claim 13, wherein each photodiode, of the plurality of the photodiodes, includes a first N-type impurity region having a first concentration of an N-type impurity and a second N-type impurity region having a second concentration of an N-type impurity that is less than the first concentration, and
    wherein each nano void region includes a first portion, having a first density of the nano voids, disposed in proximity to the first N-type impurity region, and a second portion, having a second density of the nano voids that is less than the first density, disposed in proximity to the second N-type impurity region.

15. The image sensor of claim 14, wherein the second N-type impurity region is formed between the first N-type impurity region and the color filter layer.

* * * * *